United States Patent
Diaz et al.

(10) Patent No.: US 9,911,848 B2
(45) Date of Patent: Mar. 6, 2018

(54) VERTICAL TRANSISTOR AND METHOD OF MANUFACTURING THE SAME

(71) Applicant: TAIWAN SEMICONDUCTOR MANUFACTURING CO., LTD., Hsinchu (TW)

(72) Inventors: Carlos H. Diaz, Mountain View, CA (US); Chih-Hao Wang, Baoshan Township (TW); Wai-Yi Lien, Hsinchu (TW); Kai-Chieh Yang, Kaohsiung (TW); Hao-Ling Tang, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 391 days.

(21) Appl. No.: 14/473,215

(22) Filed: Aug. 29, 2014

(65) Prior Publication Data
US 2016/0064541 A1    Mar. 3, 2016

(51) Int. Cl.
*H01L 29/78* (2006.01)
*H01L 29/66* (2006.01)
(Continued)

(52) U.S. Cl.
CPC .......... *H01L 29/7845* (2013.01); *B82Y 10/00* (2013.01); *B82Y 40/00* (2013.01);
(Continued)

(58) Field of Classification Search
USPC .......................................... 257/316–19, 326
See application file for complete search history.

(56) References Cited

U.S. PATENT DOCUMENTS

| 6,603,168 B1 * | 8/2003 | Choi ................. H01L 27/10808 257/302 |
| 2008/0185659 A1 * | 8/2008 | Ke .................. H01L 21/823807 257/371 |

(Continued)

FOREIGN PATENT DOCUMENTS

| KR | 10-2001-0098730 A | 11/2001 |
| KR | 10-2014-0005777 A | 1/2014 |
| KR | 10-2014-0058278 A | 5/2014 |

*Primary Examiner* — Moazzam Hossain
*Assistant Examiner* — Hajar Kolahdouzan
(74) *Attorney, Agent, or Firm* — McDermott Will & Emery LLP

(57) ABSTRACT

A vertical transistor includes a source-channel-drain structure, a gate and a gate dielectric layer. The source-channel-drain structure includes a source, a drain over the source and a channel between the source and the drain. The gate surrounds a portion of the channel. The gate is configured to provide compressive strain substantially along an extending direction of the channel when the vertical transistor is an n-channel vertical transistor, or the gate is configured to provide tensile strain substantially along the extending direction of the channel when the vertical transistor is a p-channel vertical transistor. In some embodiments, the vertical transistor further includes an ILD configured to provide tensile strain substantially along an extending direction of the channel when the vertical transistor is an n-channel vertical transistor, or configured to provide compressive strain substantially along an extending direction of the channel when the vertical transistor is a p-channel vertical transistor.

20 Claims, 13 Drawing Sheets

(51) Int. Cl.
*H01L 29/423* (2006.01)
*H01L 29/06* (2006.01)
*H01L 29/49* (2006.01)
*H01L 29/775* (2006.01)
*H01L 21/8238* (2006.01)
*H01L 27/092* (2006.01)
*B82Y 10/00* (2011.01)
*B82Y 40/00* (2011.01)
*H01L 29/08* (2006.01)

(52) U.S. Cl.
CPC ............... *H01L 21/823807* (2013.01); *H01L 21/823885* (2013.01); *H01L 27/092* (2013.01); *H01L 29/0676* (2013.01); *H01L 29/0847* (2013.01); *H01L 29/42356* (2013.01); *H01L 29/42392* (2013.01); *H01L 29/495* (2013.01); *H01L 29/4966* (2013.01); *H01L 29/66439* (2013.01); *H01L 29/66666* (2013.01); *H01L 29/775* (2013.01); *H01L 29/7843* (2013.01)

(56) References Cited

U.S. PATENT DOCUMENTS

| | | |
|---|---|---|
| 2011/0260258 A1 | 10/2011 | Zhu et al. |
| 2011/0303973 A1* | 12/2011 | Masuoka .......... H01L 21/26586 257/329 |
| 2012/0104508 A1* | 5/2012 | Zhu ................ H01L 21/823807 257/369 |
| 2014/0011358 A1 | 1/2014 | Chen et al. |
| 2014/0124728 A1 | 5/2014 | Kim et al. |
| 2015/0053929 A1* | 2/2015 | Lee ....................... H01L 29/775 257/29 |
| 2015/0279970 A1* | 10/2015 | Zhang ............... H01L 29/66795 438/157 |

* cited by examiner

VERTICAL TRANSISTOR AND METHOD OF MANUFACTURING THE SAME

BACKGROUND

A transistor basically includes a source, a drain, a channel therebetween and a gate. Conduction selectively occurs or is prevented within the channel depending on a voltage applied to the gate, as is well known. Carrier mobility is a principal factor in maintaining adequate performance of the transistor, which affects the amount current or charge flowing in the channel under control of the voltage applied to the gate.

A transistor having low carrier mobility will reduce not only the switching speed but also reduce the difference between "on" resistance and "off" resistance. Therefore, improvements in carrier mobility of the channel continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
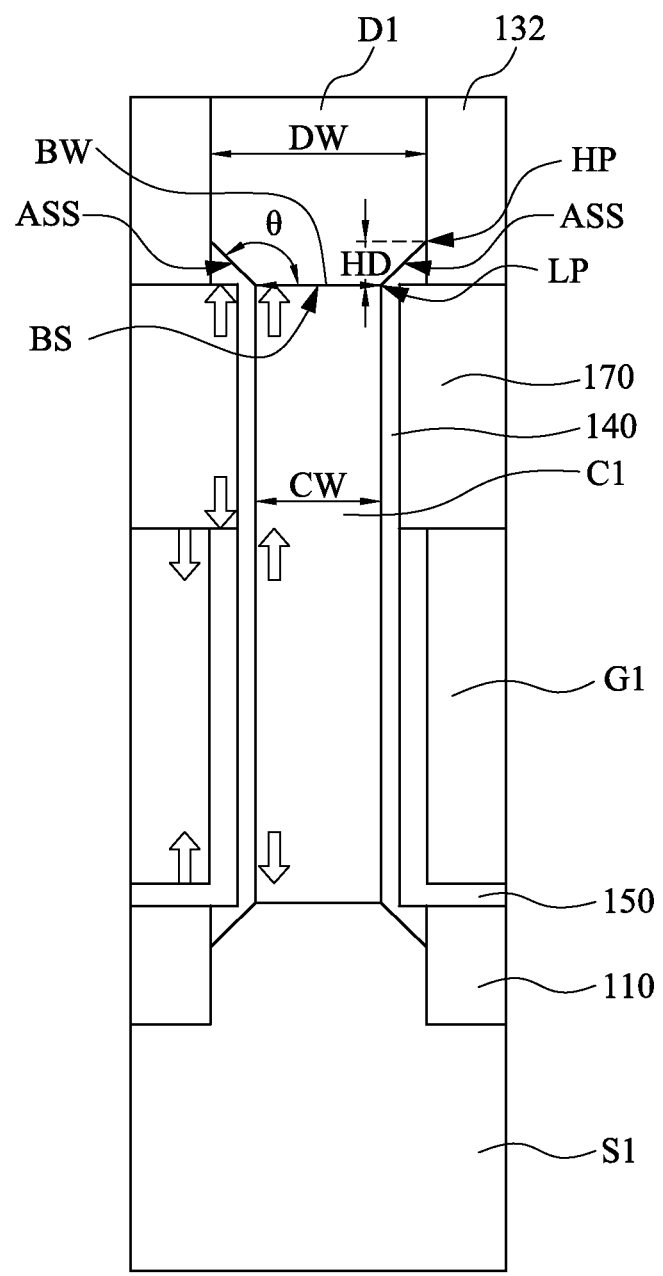
FIG. 1 is a cross-sectional view of an n-channel vertical transistor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a vertical transistor having strain enhancement, which may be provided from a gate, an inter-layer dielectric (ILD) or a combination thereof, so as to effectively improve carrier (e.g., electron or hole) mobility. Embodiments of the vertical transistor and a method for manufacturing the same will be sequentially described below in detail.

FIG. 1 is a cross-sectional view of an n-channel vertical transistor in accordance with some embodiments of the present disclosure. The n-channel vertical transistor includes a source-channel-drain structure, a gate G1 and a gate dielectric layer 140. The source-channel-drain structure includes a source S1, a drain D1 and a channel C1 between the source S1 and the drain D1. In some embodiments, the source-channel-drain structure is a nanowire. In some embodiments, the source-channel-drain structure has a shape of circle, rectangle, ellipsoid or another shape in a top view. In some embodiments, the n-channel vertical transistor includes a plurality of the source-channel-drain structures substantially parallel to one another. Sources of the source-channel-drain structures may be coupled or connected to one another, and/or drains thereof may be coupled or connected to one another.

In some embodiments, the source S1 is over a substrate (not shown). In some embodiments, the substrate includes an elementary semiconductor including silicon or germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the source S1 is a heavily n-doped layer. In some embodiments, the source S1 includes n-type dopants, such as phosphorus, arsenic, antimony, bismuth, selenium, tellurium, another suitable n-type dopants or a combination thereof. In some embodiments, the source S1 has a dopant concentration ranging from about $10^{19}$ ions/cm$^3$ to about $10^{22}$ ions/cm$^3$. In some embodiments, the substrate includes a well region (not shown) of a conductivity type, which is different from that of the source S1, extending into the substrate from an upper surface thereof. In some embodiments, the source S1 is on and in contact with the well region. In some embodiments, the well region is a p-type well region.

The drain D1 is over the source S1. The channel C1 is between the source S1 and the drain D1. In some embodiments, the drain D1 is a heavily n-doped layer. In some embodiments, the drain D1 includes n-type dopants. In some embodiments, the drain D1 has a dopant concentration ranging from about $10^{19}$ ions/cm$^3$ to about $10^{22}$ ions/cm$^3$. In some embodiments, the channel is a lightly n-doped layer. In some embodiments, the channel C1 includes n-type dopants. In some embodiments, the channel C1 has a dopant concentration ranging from about $10^{16}$ ions/cm$^3$ to about $10^{19}$ ions/cm$^3$.

The gate G1 surrounds a portion of the channel C1. In other embodiments, the gate surrounds the entire channel. In other words, the n-channel vertical transistor belongs to a vertical gate-all-around (VGAA) n-channel vertical transistor. It is noteworthy that in some embodiments, the gate G1 is configured to provide compressive strain substantially along an extending direction of the n-channel C1, and thus to generate tensile strain in the n-channel C1 to increase electron mobility. In some embodiments, the gate G1 configured to provide compressive strain substantially along the extending direction of the channel C1 includes titanium-aluminum (TiAl), titanium-aluminum carbide (TiAlC), a combination thereof or another suitable material. In some embodiments, the gate G1 provides compressive strain of about 0.5 to about 3 GPa. In some embodiments, the gate G1 has a thickness of about 2 to about 10 nm.

The gate dielectric layer 140 is disposed between the channel C1 and the gate G1. In some embodiments, the gate dielectric layer 140 includes a dielectric material such as silicon oxide, silicon nitride, silicon oxynitride, high-k material (e.g., hafnium oxide (HfOx), zirconium oxide (ZrOx) or aluminum oxide ($Al_2O_3$)) or another suitable insulating material.

In some embodiments, the vertical transistor further includes an ILD 170 over the gate G1 and in contact with the gate dielectric layer 140 and surrounding another portion of the channel C1. In some embodiments, the ILD 170 includes a dielectric material such as silicon nitride, silicon oxynitride or another suitable insulating material. It is noteworthy that in some embodiments, the ILD 170 is configured to provide tensile strain substantially along the extending direction of the n-channel C1, and thus to generate tensile strain in the n-channel C1 to increase electron mobility. In some embodiments, the ILD 170 configured to provide tensile strain is formed using a deposition process under control of power. In some embodiments, the ILD 170 provides tensile strain of about 0.5 to about 2 GPa. In some embodiments, the ILD 170 has a thickness of about 3 to about 20 nm.

It is worth noting that in some embodiments, the drain D1 has a width DW greater than a width CW of the channel C1, and thus to provide a support surface (i.e., angled side surface ASS) for retaining tensile strain provided from the ILD 170. Therefore, tensile strain provided from the ILD 170 may be strengthen due to the presence of the angled side surface ASS. In some embodiments, the width DW is ranging from about 10 to about 20 nm. In some embodiments, the width CW is ranging from about 5 to about 15 nm. In some embodiments, the width DW of the drain D1 is greater than a bottom width BW of the drain D. In some embodiments, a width difference between the width DW of the drain D1 and the bottom width BW of the drain D1 is lower than or equal to about 10 nm. In some embodiments, the drain D1 has a bottom surface BS and the angled side surface ASS surrounding the bottom surface BS, and an included angle θ between the bottom surface BS and the angled side surface ASS is greater than 90-degrees and smaller than 180-degrees. In some embodiments, the included angle θ is ranging from about 105-degrees to about 170-degrees. In some embodiments, a height difference HD between a highest point HP of the angled side surface ASS and a lowest point LP of the angled side surface ASS is lower than or equal to about 30 nm.

In some embodiments, the gate G1 and the ILD 170 are configured to respectively provide compressive strain and tensile strain to generate more tensile strain in the n-channel C1 to further increase electron mobility. However, in some embodiments, the ILD 170 independently providing tensile strain substantially along the extending direction of the n-channel C1 also can let electron mobility be increased. In some embodiments, the gate G1 independently providing compressive strain substantially along the extending direction of the n-channel C1 also can let electron mobility be increased.

In some embodiments, the vertical transistor further includes a source dielectric layer 110 between the source S1 and the gate G1 to electrically isolate the source S1 from the gate G1. In some embodiments, the source dielectric layer 110 includes a dielectric material such as silicon nitride, silicon oxynitride or another suitable insulating material.

In some embodiments, the vertical transistor further includes a high-k dielectric layer 150 between the gate dielectric layer 140 and the gate G1 and between the source dielectric layer 110 and the gate G1. In some embodiments, the high-k dielectric layer 150 includes $HfO_2$, $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, a combination thereof or another suitable material.

In some embodiments, the vertical transistor further includes a spacer 132 surrounds the drain D1. In some embodiments, the spacer 132 includes a dielectric material such as silicon oxide, silicon nitride, silicon oxynitride or another suitable insulating material. In some embodiments, the spacer 132 has a thickness of about 2 to about 15 nm.

Figure 2:
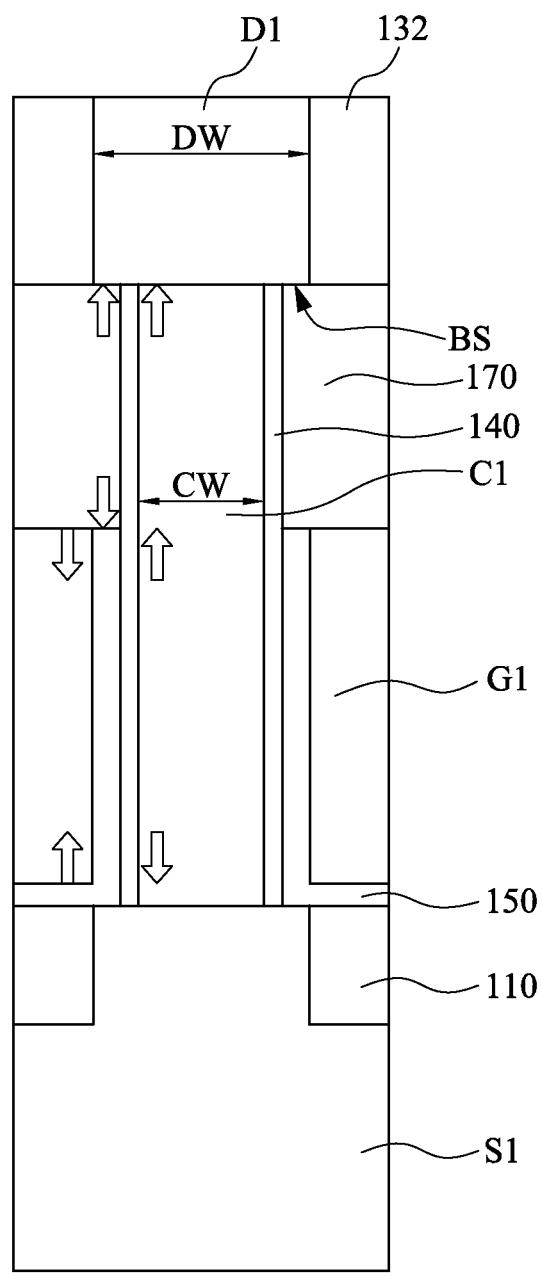
FIG. 2 is a cross-sectional view of an n-channel vertical transistor in accordance with some embodiments of the present disclosure.

FIG. 2 is a cross-sectional view of an n-channel vertical transistor in accordance with other embodiments of the present disclosure. The difference between the embodiments of FIGS. 1 and 2 is that the drain D1 of FIG. 2 has a substantially uniform width DW. In the embodiments, the drain D1 provides a support surface (i.e., bottom surface BS not in contact with the channel C1) for retaining tensile strain provided from the ILD 170.

Figure 3:
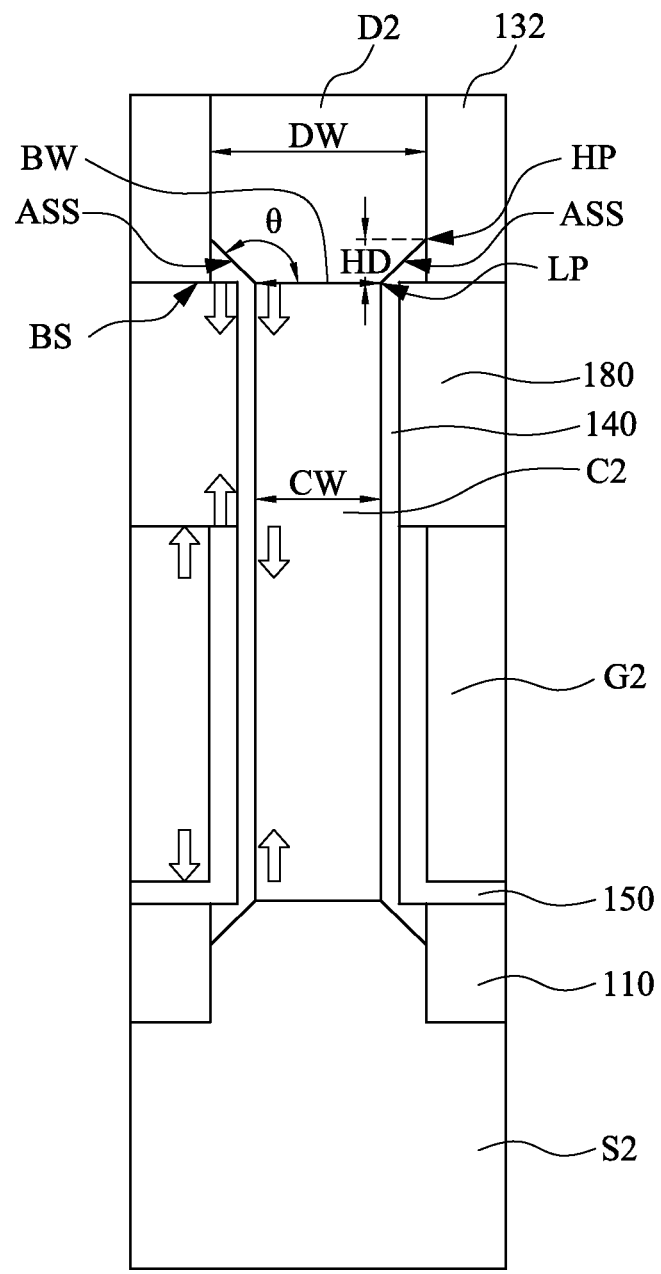
FIG. 3 is a cross-sectional view of a p-channel vertical transistor in accordance with some embodiments of the present disclosure.

FIG. 3 is a cross-sectional view of a p-channel vertical transistor in accordance with some embodiments of the present disclosure. The p-channel vertical transistor includes a source-channel-drain structure including a source S2, a drain D2 and a channel C2 therebetween, a gate G2 and a gate dielectric layer 140. In some embodiments, the source-channel-drain structure is a nanowire. In some embodiments, the source-channel-drain structure has a shape of circle, rectangle, ellipsoid or another shape in a top view. In some embodiments, the vertical transistor includes a plurality of the source-channel-drain structures substantially parallel to one another. Sources of the source-channel-drain structures may be connected to one another, and/or drains thereof may be connected to one another.

In some embodiments, the source S2 is over a substrate (not shown). In some embodiments, the source S2 is a heavily p-doped layer. In some embodiments, the source S2 includes p-type dopants, such as boron, boron difluoride, or another suitable p-type dopants or a combination thereof. In some embodiments, the source S2 has a dopant concentration ranging from about $10^{19}$ ions/$cm^3$ to about $10^{22}$ ions/$cm^3$. In some embodiments, the substrate includes a well region (not shown) of a conductivity type, which is different from that of the source S2, extending into the substrate from an upper surface thereof. In some embodiments, the source S2 is on and in contact with the well region. In some embodiments, the well region is an n-type well region.

The drain D2 is over the source S2. The channel C2 is between the source S2 and the drain D2. In some embodiments, the drain D2 is a heavily p-doped layer. In some embodiments, the drain D2 includes p-type dopants. In some embodiments, the drain D2 has a dopant concentration ranging from about $10^{19}$ ions/$cm^3$ to about $10^{22}$ ions/$cm^3$. In some embodiments, the channel is a lightly p-doped layer. In some embodiments, the channel C2 includes p-type dopants.

In some embodiments, the channel C2 has a dopant concentration ranging from about $10^{16}$ ions/cm$^3$ to about $10^{19}$ ions/cm$^3$.

The gate G2 surrounds a portion of the channel C2. In other embodiments, the gate surrounds the entire channel. It is noteworthy that in some embodiments, the gate G2 is configured to provide tensile strain substantially along an extending direction of the p-channel C2, and thus to generate compressive strain in the p-channel C2 to increase hole mobility. In some embodiments, the gate G2 configured to provide tensile strain substantially along the extending direction of the channel C2 includes tungsten (W) or another suitable material. In some embodiments, the gate G2 provides compressive strain of about 0.5 to about 3 GPa. In some embodiments, the gate G2 has a grain size of about 5 to about 50 nm. In some embodiments, the gate G2 has a thickness of about 2 to about 50 nm.

The gate dielectric layer 140 is between the channel C2 and the gate G2. In some embodiments, the gate dielectric layer 140 includes a dielectric material, such as silicon oxide, silicon nitride, silicon oxynitride or another suitable insulating material.

In some embodiments, the vertical transistor further includes an ILD 180 over the gate G2 and in contact with the gate dielectric layer 140 and surrounding another portion of the channel C2. In some embodiments, the ILD 180 includes a dielectric material such as silicon nitride, silicon oxynitride or another suitable insulating material. It is noteworthy that in some embodiments, the ILD 180 is configured to provide compressive strain substantially along the extending direction of the p-channel C2, and thus to generate compressive strain in the p-channel C2 to increase hole mobility. In some embodiments, the ILD 180 configured to provide compressive strain is formed using a deposition process under control of power. In some embodiments, the ILD 180 provides compressive strain of about 0.5 to about 2 GPa. In some embodiments, the ILD 180 has a thickness of about 3 to about 20 nm.

In some embodiments, the drain D2 has a width DW greater than a width CW of the channel C2, and thus to provide a support surface (i.e., angled side surface ASS) for retaining compressive strain provided from the ILD 180. Therefore, compressive strain provided from the ILD 180 may be strengthen due to the presence of the angled side surface ASS. Dimensions of the drain D2 may be referred to those exemplified for the drain D1 of FIG. 1.

In some embodiments, as shown in FIG. 3, the gate G2 and the ILD 180 are configured to respectively provide tensile strain and compressive strain to generate more compressive strain in the p-channel C2 to further increase hole mobility. However, in some embodiments, the ILD 180 independently providing compressive strain substantially along the extending direction of the p-channel C2 also can let hole mobility be increased. In some embodiments, the gate G2 independently providing tensile strain substantially along the extending direction of the p-channel C2 also can let hole mobility be increased.

In some embodiments, the vertical transistor further includes a source dielectric layer 110 between the source S2 and the gate G2 to electrically isolate the source S2 from the gate G2. In some embodiments, the vertical transistor further includes a spacer 132 surrounds the drain D2. In some embodiments, the spacer 132 has a thickness of about 2 to about 15 nm. In some embodiments, the vertical transistor further includes a high-k dielectric layer 150 between the gate dielectric layer 140 and the gate G2 and between the source dielectric layer 110 and the gate G2.

Figure 4:
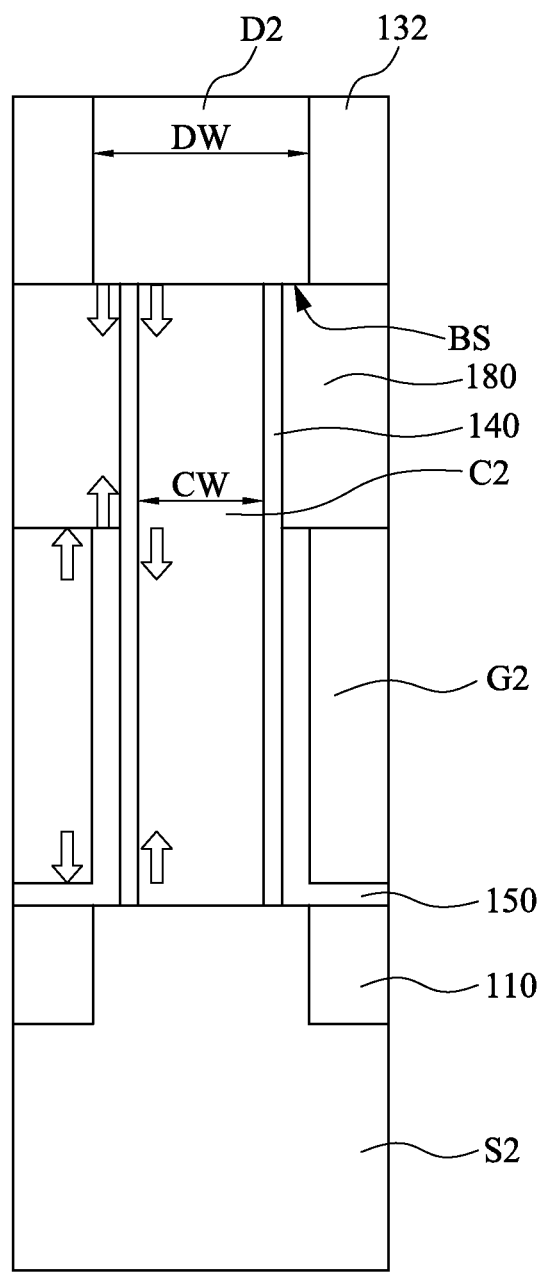
FIG. 4 is a cross-sectional view of a p-channel vertical transistor in accordance with some embodiments of the present disclosure.

FIG. 4 is a cross-sectional view of a p-channel vertical transistor in accordance with other embodiments of the present disclosure. The difference between the embodiments of FIGS. 3 and 4 is that the drain D2 of FIG. 4 has a substantially uniform width DW. In the embodiments, the drain D2 provides a support surface (i.e., bottom surface BS not in contact with the channel C2) for retaining compressive strain provided from the ILD 180.

Figure 5A:
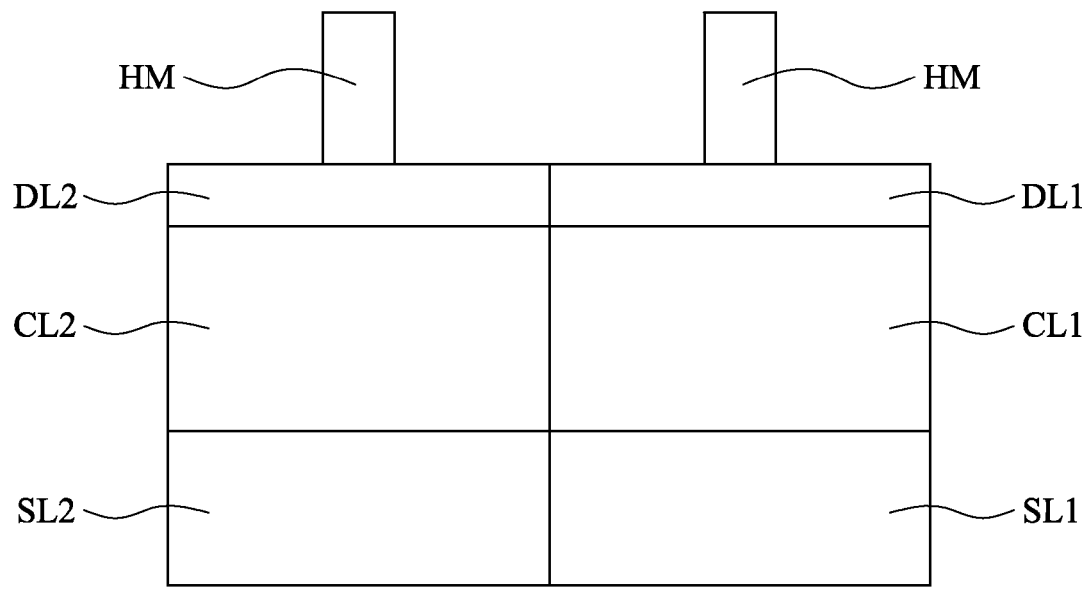
FIGS. 5A-5Q are cross-sectional views at various stages of manufacturing an n-channel vertical transistor and a p-channel vertical transistor in accordance with some embodiments of the present disclosure.
Figure 5B:
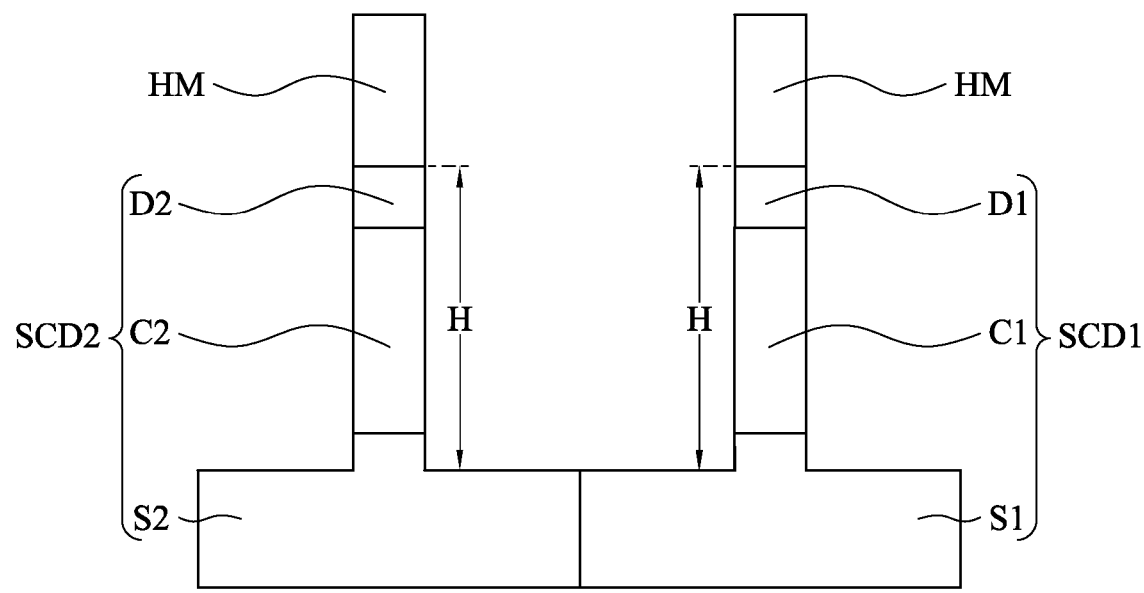
Figure 5C:
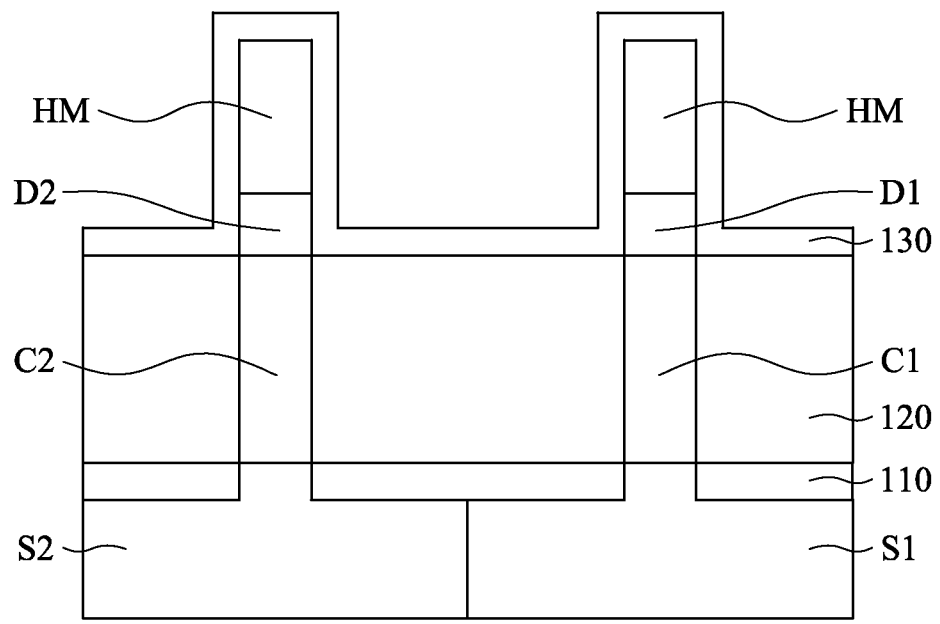
Figure 5D:
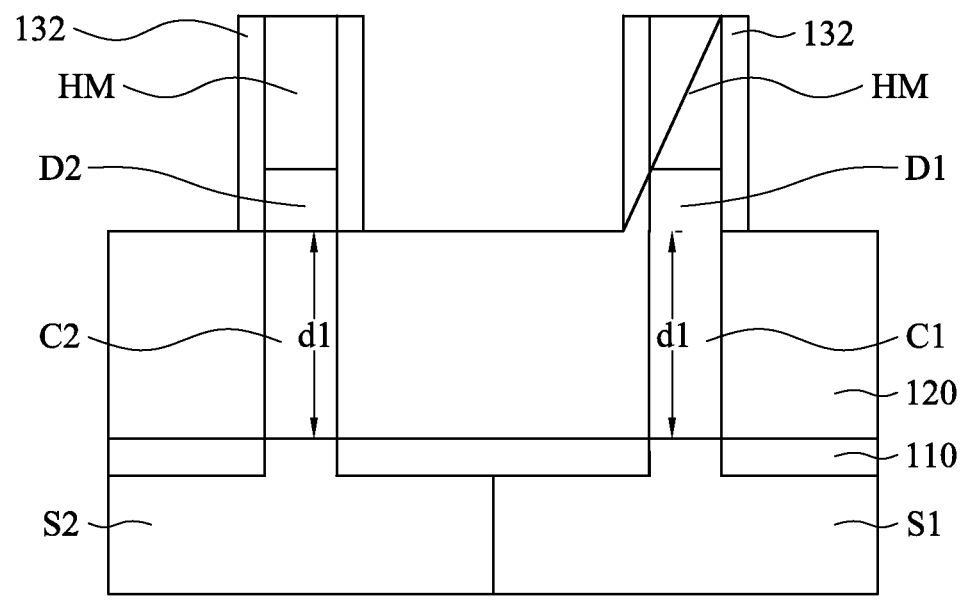
Figure 5E:
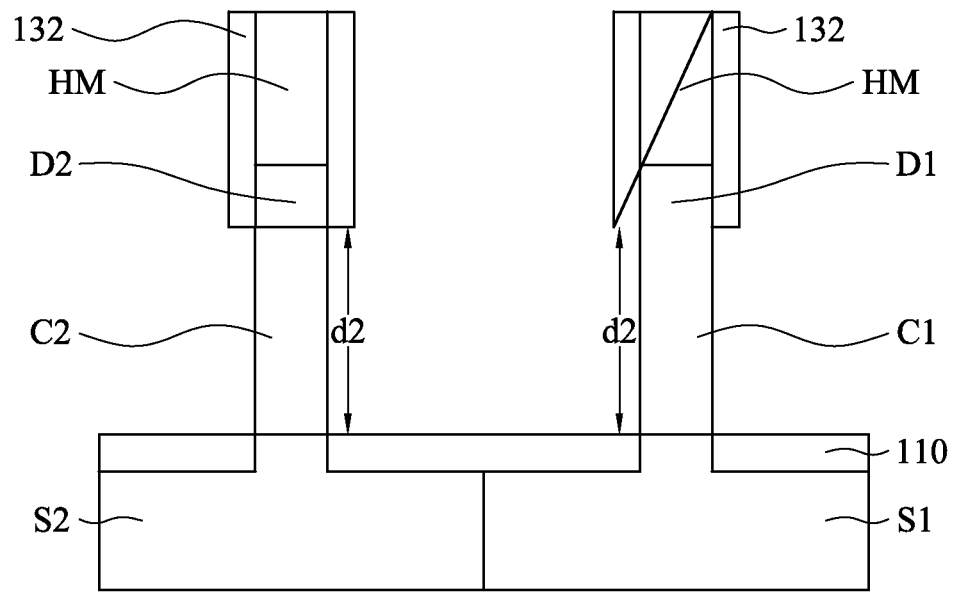
Figure 5F:
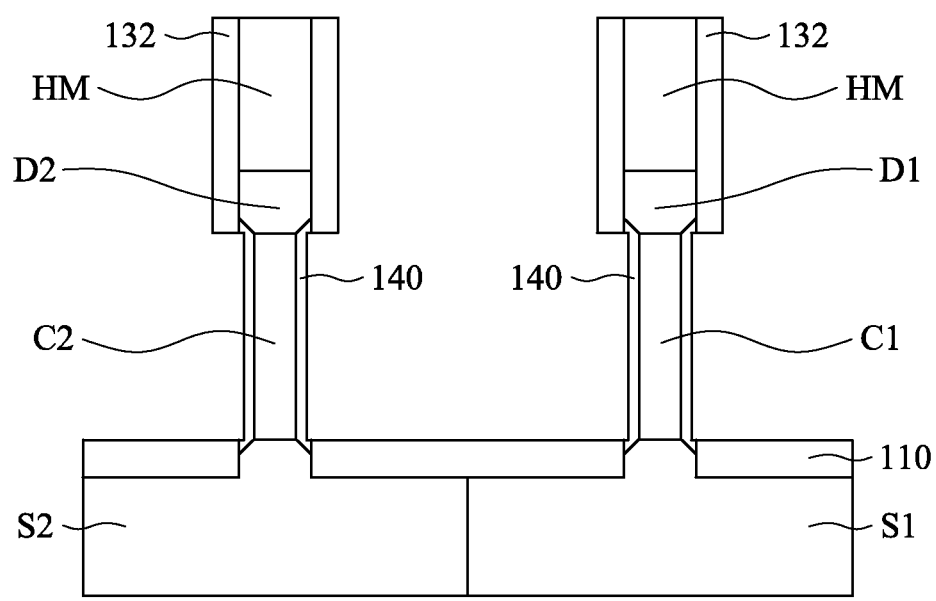
Figure 5G:
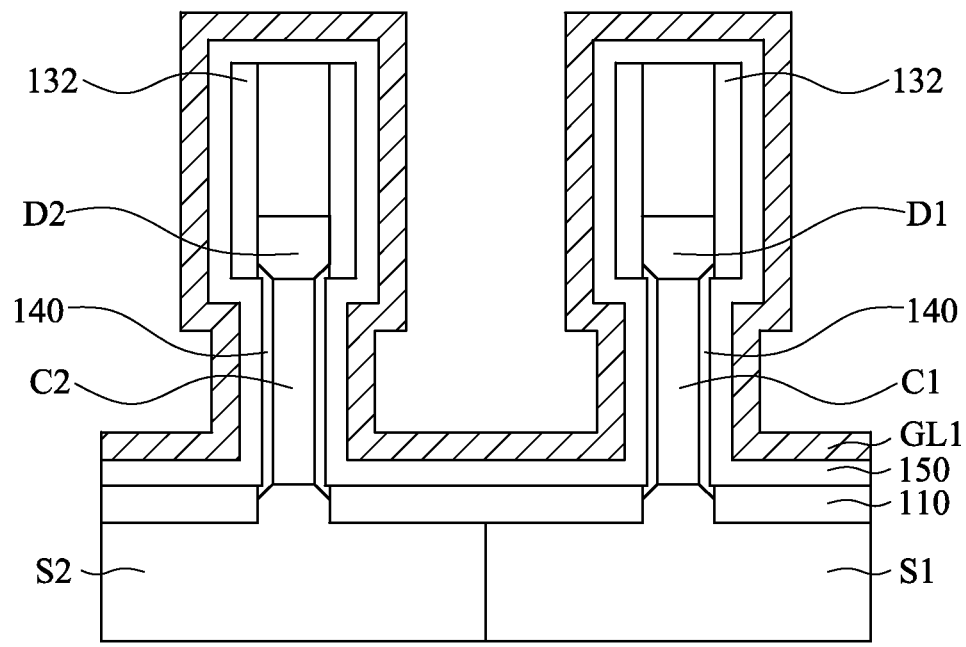
Figure 5H:
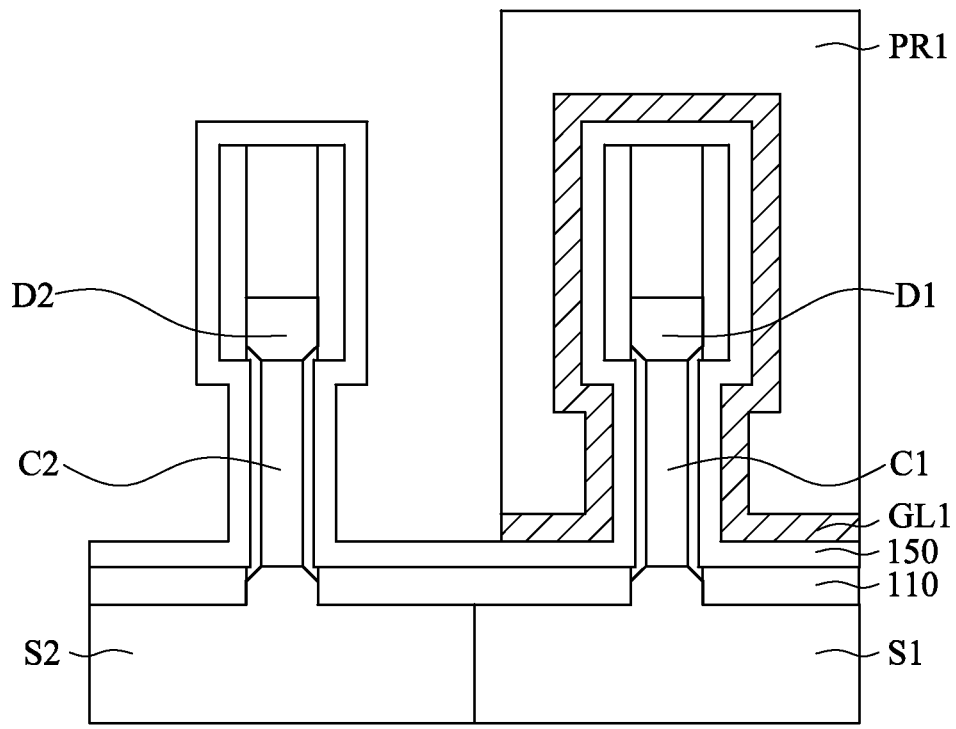
Figure 5I:
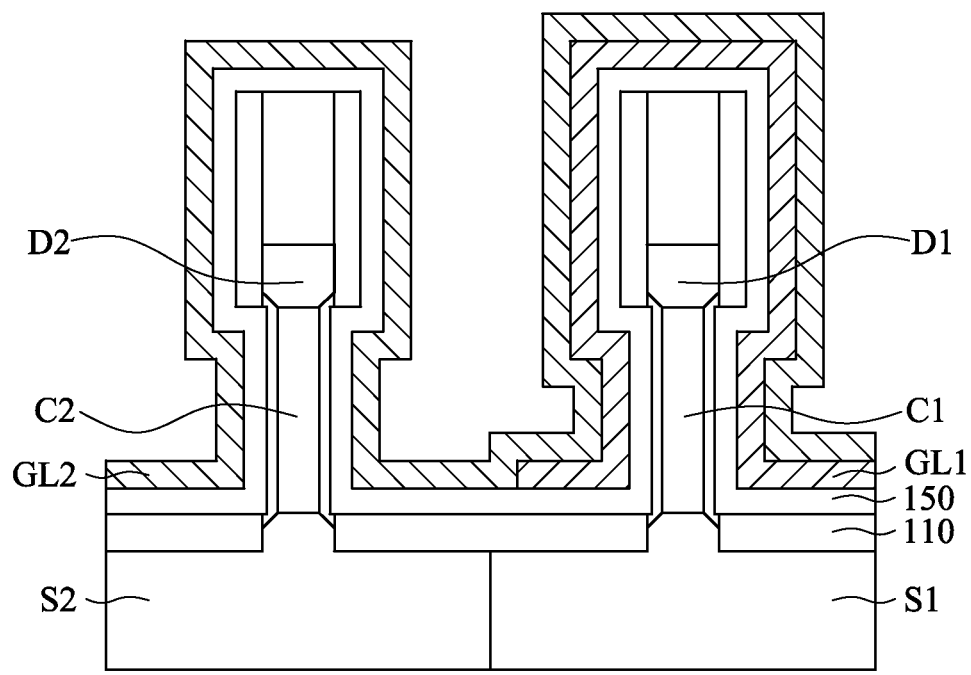
Figure 5J:
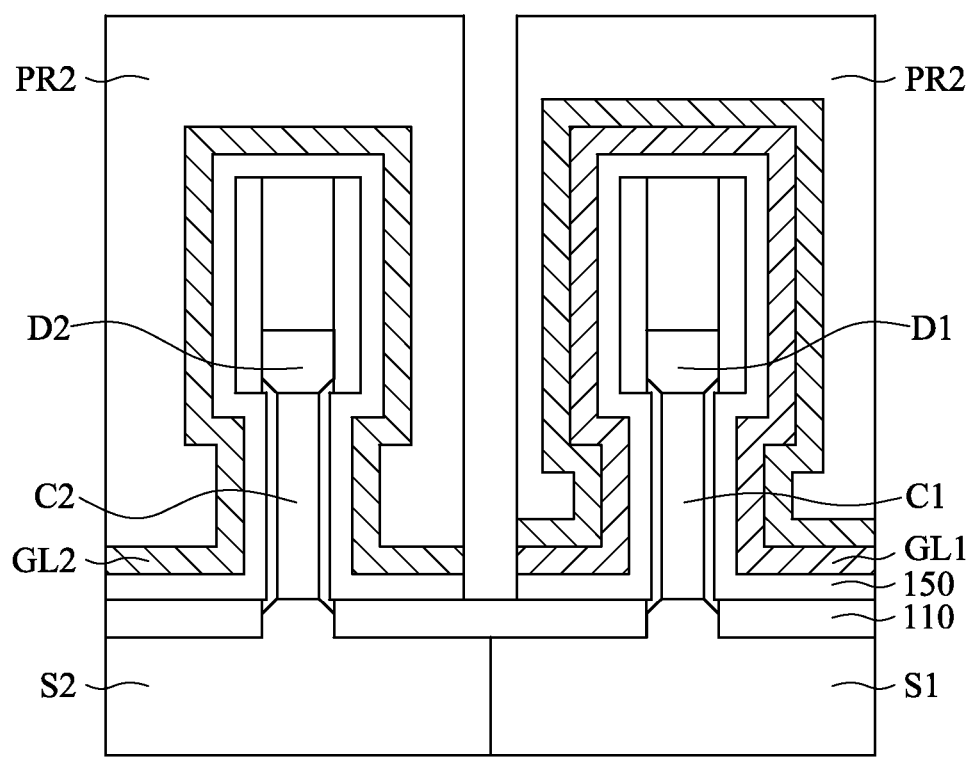
Figure 5K:
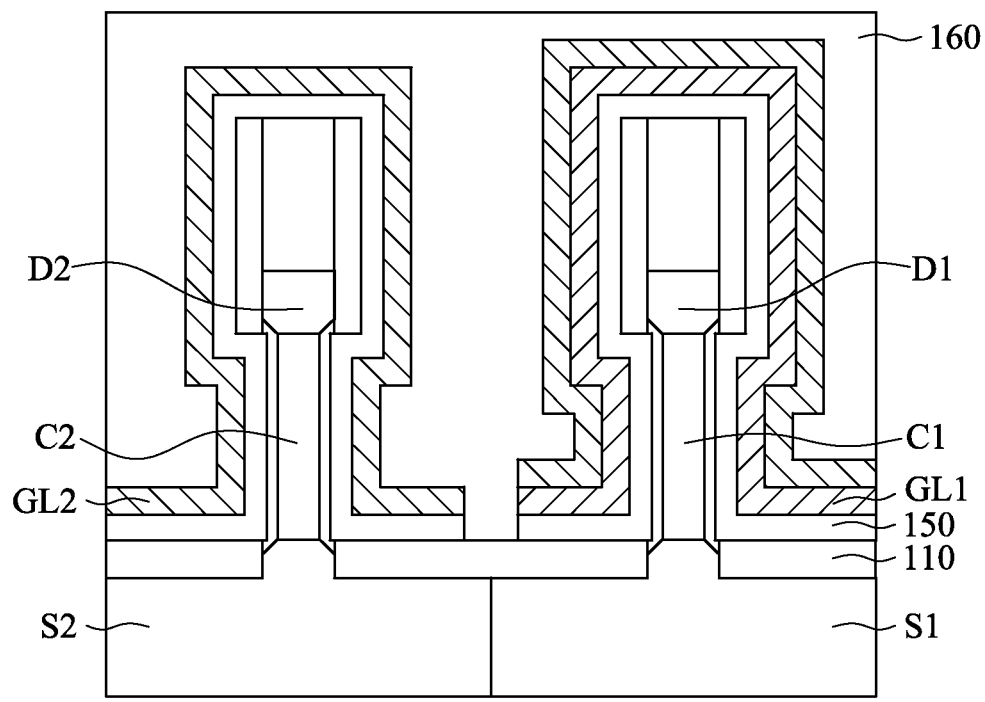
Figure 5L:
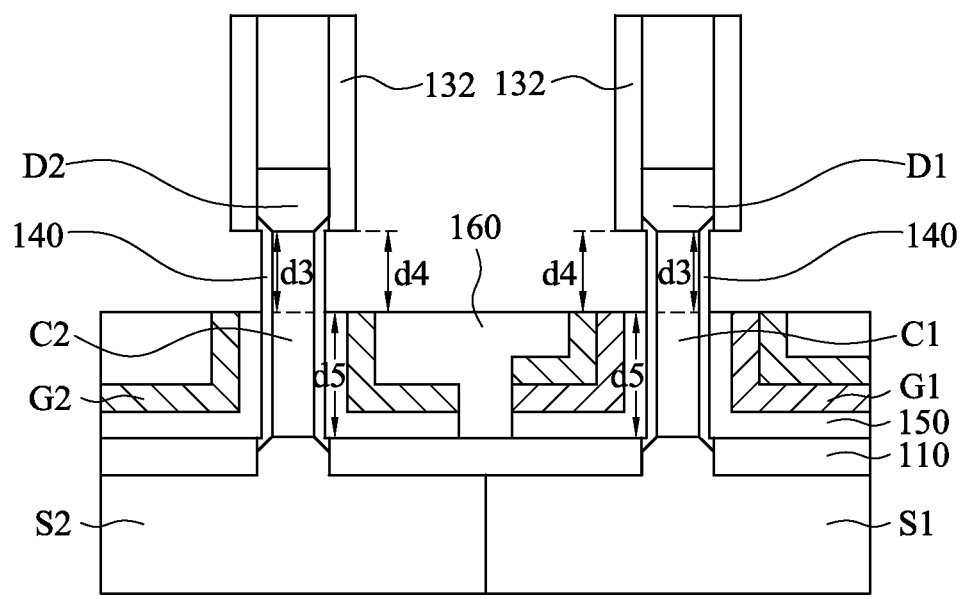
Figure 5M:
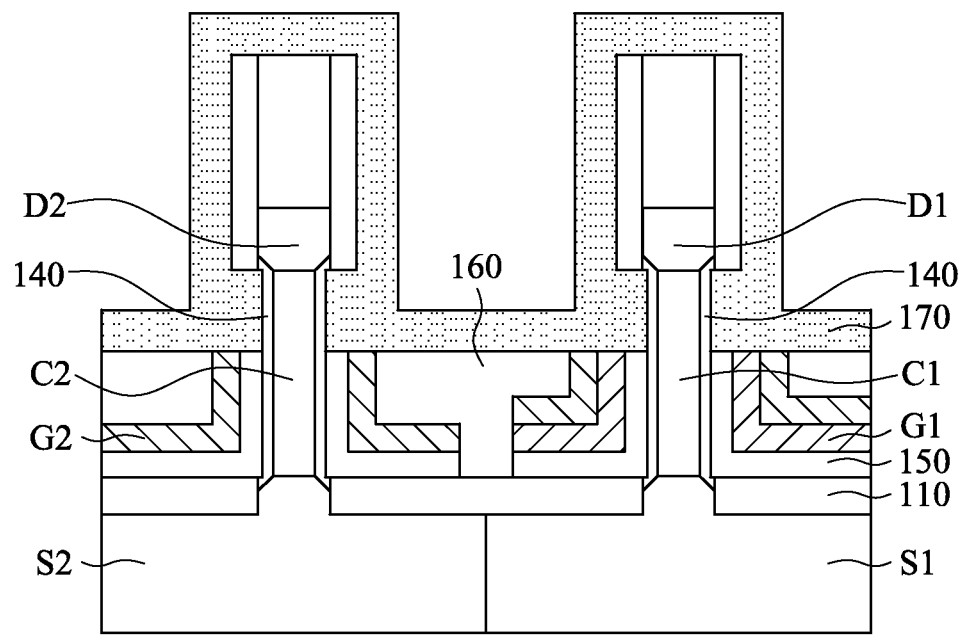
Figure 5N:
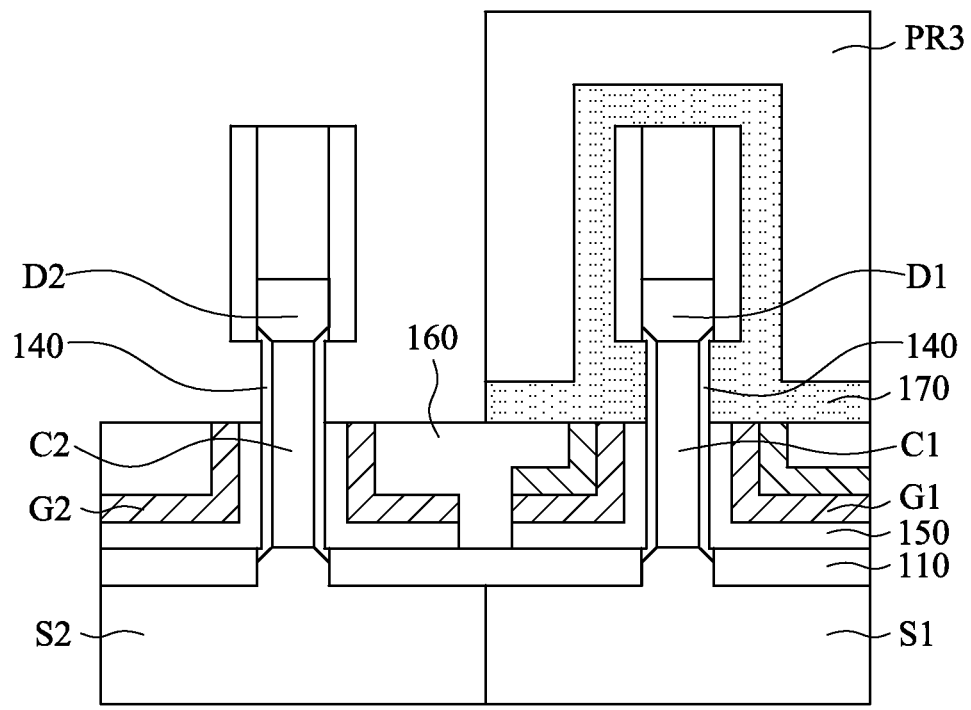
Figure 5O:
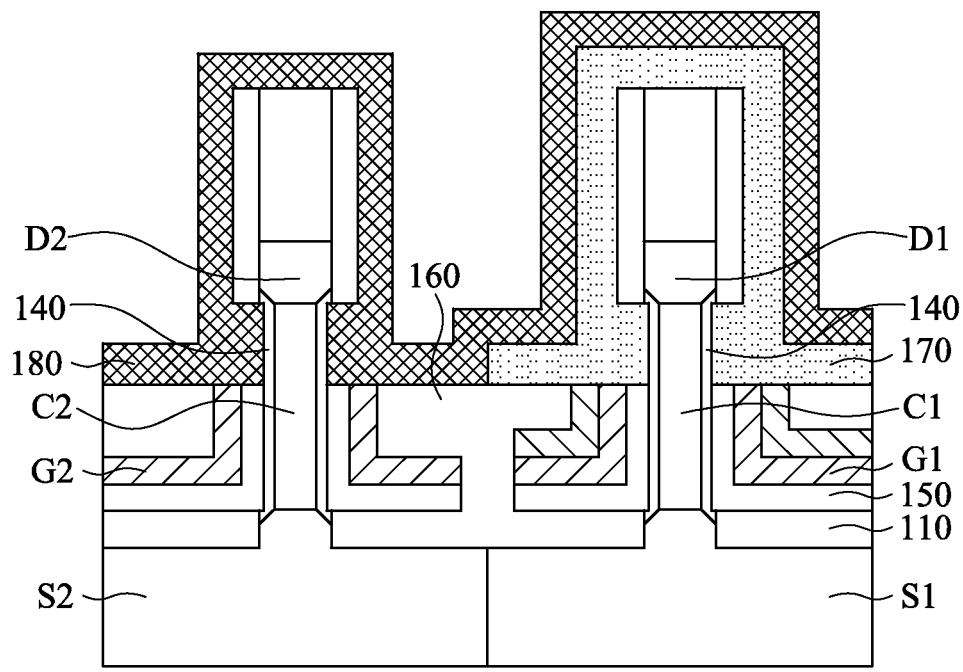
Figure 5P:
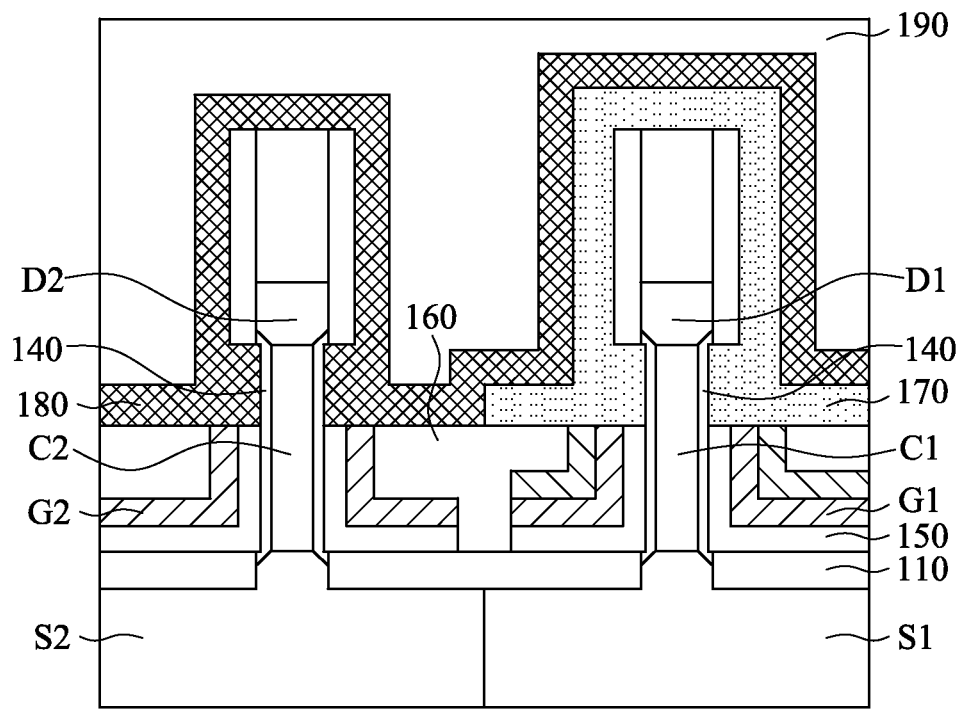
Figure 5Q:
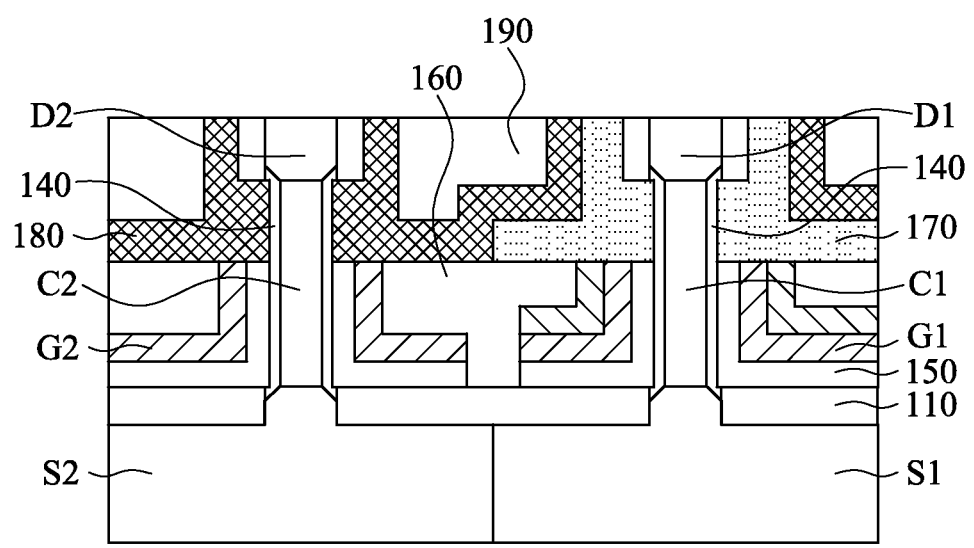

FIGS. 5A-5Q are cross-sectional views at various stages of manufacturing an n-channel vertical transistor and a p-channel vertical transistor in accordance with some embodiments of the present disclosure. It can be understood that embodiments of a method for manufacturing the n-channel vertical transistor or the p-channel vertical transistor may be included in the embodiments exemplified below.

As shown in FIG. 5A, source layers SL1, SL2, channel layers CL1, CL2 and drain layers DL1, DL2 are formed. In the embodiments, the source layers SL1, SL2 are formed laterally adjacent to each other, and the channel layers CL1, CL2 are formed laterally adjacent to each other, and the drain layers DL1, DL2 are formed laterally adjacent to each other. In some embodiments, the source layer SL1, the channel layer CL1 and the drain layer DL1 are n-type, and the source layer SL2, the channel layer CL2 and the drain layer DL2 are p-type. In other embodiments, the source layers are separated from each other, and the channel layers are separated from each other, and the drain layers are separated from each other. In some embodiments, the source layers SL1, SL2, the channel layers CL1, CL2 and the drain layers DL1, DL2 are formed by epitaxial (epi) growth and doping processes with different types of dopants and different dopant concentrations. In some embodiments, the source layers SL1, SL2, the channel layers CL1, CL2 and the drain layers DL1, DL2 are formed using ion implantation and annealing processes. In some embodiments, each of the source layers SL1, SL2 and the drain layers DL1, DL2 has a dopant concentration ranging from about $10^{19}$ ions/cm$^3$ to about $10^{22}$ ions/cm$^3$. In some embodiments, each of the channel layers CL1, CL2 has a dopant concentration ranging from about $10^{16}$ ions/cm$^3$ to about $10^{19}$ ions/cm$^3$.

Subsequently, a hard mask layer HM is formed over the drain layers DL1, DL2, as shown in FIG. 5A. In some embodiments, a hard mask material is formed using a chemical vapor deposition (CVD) process, a physical vapor deposition (PVD) process, spin-on coating, or another suitable formation process, and then patterned using a photolithography process or another suitable material removal process to form the hard mask layer HM. In some embodiments, the hard mask layer HM is made of silicon nitride, silicon carbon nitride (SiCN), silicon oxycarbonitride (SiOCN) or another suitable materials.

As shown in FIGS. 5A-5B, the drain layers DL1, DL2, the channel layers CL1, CL2 and the source layers SL1, SL2 of FIG. 5A are patterned according to the hard mask layer HM to form a first source-channel-drain structure SCD1 and a second source-channel-drain structure SCD2. The first source-channel-drain structure SCD1 includes a source S1, a drain D1 over the source S1 and a channel C1 therebetween. The second source-channel-drain structure SCD2 includes a source S2, a drain D2 over the source S2 and a channel C2 therebetween. In some embodiments, as shown in FIG. 5A, the drain layers DL1, DL2 exposed from the hard mask layer HM and the channel layers CL1, CL2 and the source layers SL1, SL2 therebeneath are removed by a dry etching process. In some embodiments, the etchant includes carbon fluorides ($C_xF_y$), sulfur hexafluoride ($SF_6$), oxygen gas (O₂), helium (He), carbon chlorides (C$_x$Cl$_y$), argon (Ar) or another suitable etchant material. In some embodiments, the first source-channel-drain structure SCD1 and the second source-channel-drain structure SCD2 are nanowires. In some embodiments, the nanowire has a height H ranging from about 40 to about 100 nm.

As shown in FIG. 5C, a source dielectric layer 110, a dummy dielectric layer 120 and a spacer layer 130 are formed. The source dielectric layer 110 is configured to act as a spacer of the sources S1, S2. The dummy dielectric layer 120 will be removed in a subsequent operation. The spacer layer 130 is configured to form a spacer covering the drains D1, D2 in a subsequent operation. In some embodiments, each of the source dielectric layer 110, the dummy dielectric layer 120 and the spacer layer 130 is formed using a CVD process, a PVD process, a spin-on coating process or another suitable formation process. In some embodiments, a dummy dielectric material is deposited over the source dielectric layer 110 and surrounding the channels C1, C2 and covering the drains D1, D2 and the hard mask layer HM, and then planarized and etched back to form the dummy dielectric layer 120 exposing the drains D1, D2; subsequently, the spacer layer 130 is blanket formed covering the drains D1, D2 and the hard mask layer HM. In some embodiments, the source dielectric layer 110 and the spacer layer 130 are made of silicon nitride, SiCN, SiOCN or another suitable materials. In some embodiments, the dummy dielectric layer 120 is made of silicon oxide, silicon oxynitride or another suitable materials.

As shown in FIGS. 5C-5D, the spacer layer 130 is etched to form a spacer 132 covering sidewalls of the drains D1, D2. In some embodiments, an anisotropic dry etching process is performed on the spacer layer 130 to form the spacer 132 along sidewalls of the drains D1, D2. In some embodiments, the spacer 132 has a thickness of about 2 to about 15 nm. In some embodiments, a distance d1 between the source S1 and the drain D1 or between the source S2 and the drain D2 is ranging from about 10 to about 100 nm.

As shown in FIGS. 5D-5E, the dummy dielectric layer 120 is removed to expose the channels C1, C2. In some embodiments, a distance d2 between the source dielectric layer 110 and the spacer 132 is ranging from about 10 to about 100 nm. In some embodiments, the distance d1 shown in FIG. 5D is equal to or slightly different from the distance d2 shown in FIG. 5E.

As shown in FIGS. 5E-5F, a gate dielectric layer 140 is formed surrounding the channels C1, C2. In some embodiments, the gate dielectric layer 140 is formed using an etching process, an oxidation process, such as a wet oxidation, a dry oxidation, a plasma oxidation, or another suitable process. In some embodiments, the channels C1, C2 of FIG. 5E are laterally shrunk and narrowed to form the channels C1, C2 of FIG. 5F when the gate dielectric layer 140 is formed surrounding the channels C1, C2. In some embodiments, bottoms of the drains D1, D2 of FIG. 5E are also shrunk when the gate dielectric layer 140 is formed surrounding the channels C1, C2 to form the drains D1, D2 of FIG. 5F with a big head in a cross-sectional view. Dimensions of the drains D1, D2 may be referred to the embodiments exemplified above.

As shown in FIG. 5G, a high-k dielectric layer 150 and a gate layer GL1 are sequentially blanket formed covering the source dielectric layer 110, the gate dielectric layer 140 and the spacer 132. In some embodiments, the high-k dielectric layer 150 is blanket formed using a CVD process, an ALD (atomic layer deposition) process or another suitable formation process. In some embodiments, the gate layer GL1 is configured to provide compressive strain substantially along an extending direction of the n-channel C1, and thus to generate tensile strain in the n-channel C1 to increase electron mobility. In some embodiments, the gate layer GL1 configured to provide compressive strain is formed using a PVD process, a sputtering process or another suitable formation process. In some embodiments, the gate layer GL1 configured to provide compressive strain includes titanium-aluminum (TiAl), titanium-aluminum carbide (TiAlC), a combination thereof or another suitable material. In some embodiments, the gate layer GL1 has a thickness of about 2 to about 10 nm.

As shown in FIGS. 5G-5H, a photoresist PR1 is formed covering the drain D1, the channel C1 and the source S1, and the gate layer GL1 over the drain D2 is then removed. In some embodiments, the gate layer GL1 over the drain D2 is removed by dry etching process, wet etching process, a combination thereof or another suitable process. Subsequently, the photoresist PR1 is removed by any suitable process.

As shown in FIG. 5I, a gate layer GL2 is blanked formed covering the high-k dielectric layer 150 and the gate layer GL1. In some embodiments, the gate layer GL2 is configured to provide tensile strain substantially along an extending direction of the p-channel C2, and thus to generate compressive strain in the p-channel C2 to increase hole mobility. In some embodiments, the gate layer GL2 configured to provide tensile strain is formed using an ALD process, a CVD process, a combination thereof or another suitable process. In some embodiments, the gate layer GL2 configured to provide tensile strain includes tungsten (W) or another suitable material. In some embodiments, the gate layer GL2 has a thickness of about 2 to about 50 nm.

As shown in FIGS. 5I-5J, a photoresist PR2 is formed covering the drains D1, D2, and the gate layer GL2 exposed from the photoresist PR2 and the gate layer GL1 therebeneath are then removed to isolate the gate layer GL1 over the source S1 from the gate layer GL2 over the source S2. In some embodiments, the gate layer GL2 exposed from the photoresist PR2 and the gate layer GL1 therebeneath are removed by dry etching process, wet etching process, a combination thereof or another suitable process. Subsequently, the photoresist PR2 is removed by any suitable process.

As shown in FIG. 5K, a passivation layer 160 is formed covering the gate layer GL2. In some embodiments, the passivation layer 160 is formed using a CVD process, a PVD process, an ALD process, a spin-on process or another suitable formation process. In some embodiments, the passivation layer 160 is a multi-layer structure. In some embodiments, the passivation layer 160 includes a first passivation layer (not shown), which is blanket formed in contact with the gate layer GL2 and the source dielectric layer 110, and a second passivation layer (not shown) over the first passivation layer. In some embodiments, the first passivation layer is made of silicon nitride, silicon oxynitride or another suitable materials. In some embodiments, the second passivation layer is made of silicon oxide, silicon oxynitride or another suitable materials.

As shown in FIGS. 5K-5L, the passivation layer 160, the gate layers GL2, GL1 and the high-k dielectric layer 150 are etched back to form the gates G1, G2 and to expose portions of the gate dielectric layer 140. In some embodiments, a distance d3 is ranging from about 5 to about 25 nm. In some embodiments, a distance d4 between the spacer 132 and the gate G1 or between the spacer 132 and the gate G2 is ranging from about 5 to about 25 nm. In some embodiments, the distance d4 is ranging from about 10 to about 20 nm. In some embodiments, the distance d3 is equal to or slightly different from the distance d4. In some embodiments, a distance d5 is ranging from about 10 to about 100 nm. In some embodiments, a portion of the channel C1 not surrounded by the gate G1 and a portion of the channel C2 not surrounded by the gate G2 are acted as lightly doped drains (LDD) portion to optimize source-drain resistance (Rsd) and to reduce short channel effect (S.C.E.)

As shown in FIG. 5M, an ILD 170 is blanket formed over the drains D1, D2, the gates G1, G2 and the passivation layer 160. The ILD 170 is also formed surrounding and in contact with portions of the gate dielectric layer 140. In some embodiments, the ILD 170 is configured to provide tensile strain substantially along the extending direction of the n-channel C1, and thus to generate tensile strain in the re-channel C1 to increase electron mobility. In some embodiments, the ILD 170 configured to provide tensile strain is formed using a CVD process, a PVD process, an ALD process, a spin-on process or another suitable formation process. In some embodiments, the ILD 170 configured to provide tensile strain is formed using a PECVD process with precursors of $SiH_4$ and $NH_3$ under control of power. In some embodiments, the ILD 170 includes a dielectric material such as silicon nitride, silicon oxynitride or another suitable insulating material. In some embodiments, the ILD 170 has a thickness of about 3 to about 20 nm.

As shown in FIGS. 5M-5N, a photoresist PR3 is formed covering the drain D1 and the ILD 170 over the gate G1, and the ILD 170 over the gate G2 and the drain D2 is then removed. In some embodiments, the ILD 170 is removed by dry etching process, wet etching process, a combination thereof or another suitable process. Subsequently, the photoresist PR3 is removed by any suitable process.

As shown in FIG. 5O, an ILD 180 is blanket formed over the ILD 170, the drains D1, D2 and the gates G1, G2. The ILD 180 is also formed surrounding and in contact with a portion of the gate dielectric layer 140 surrounding the channel C2. In some embodiments, the ILD 180 is configured to provide compressive strain substantially along the extending direction of the p-channel C2, and thus to generate compressive strain in the p-channel C2 to increase hole mobility. In some embodiments, the ILD 180 configured to provide compressive strain is formed using a CVD process, a PVD process, an ALD process, a spin-on process or another suitable formation process. In some embodiments, the ILD 180 configured to provide compressive strain is formed using a PECVD process with precursors of $SiH_4$ and $NH_3$ under control of power. In some embodiments, the ILD 180 includes a dielectric material such as silicon nitride, silicon oxynitride or another suitable insulating material. In some embodiments, the ILD 180 has a thickness of about 3 to about 20 nm.

As shown in FIG. 5P, a dielectric layer 190 is formed over the ILD 180. In some embodiments, the dielectric layer 190 is formed using a CVD process, a PVD process, an ALD process, a spin-on process or another suitable formation process. In some embodiments, the dielectric layer 190 includes a dielectric material such as silicon oxide, silicon oxynitride or another suitable insulating material.

As shown in FIGS. 5P-5Q, a planarization process is performed to expose the drains D1, D2. In some embodiments, the planarization process includes a CMP process, a grinding process, an etching process or another suitable material removal process. In some embodiments, after the planarization process, an upper surface of the drain D1 and an upper surface of the drain D2 are coplanar with an upper surface of the dielectric layer 190. In some embodiments, after the planarization process is performed, drain pads (not shown) are formed respectively over the drains D1, D2. In some embodiments, a drain pad material is formed using any suitable formation process and then patterned using a photolithography/etching process or another suitable material removal process to form the drain pads. In some embodiments, the drain pads include metal, metal compound, silicide or a combination thereof. In some embodiments, metal or metal compound includes Ti, Ta, W, Al, Cu, Mo, Pt, TiN, TaN, TaC, TaSiN, WN, MoN, MoON, $RuO_2$, TiAl, TiAlN, TaCN, a combination thereof or another suitable material. In some embodiments, silicide includes cobalt silicide, titanium silicide, tungsten silicide, nickel silicide or a combination thereof.

Referring to FIG. 5Q, the source S1, the channel C1, the drain D1, the gate G1 and the gate dielectric layer 140 construct an n-channel vertical transistor. The gate G1 and the ILD 170 may independently or collectively provide strain to increase electron mobility of the n-channel C1. Specifically, the gate G1 can be configured to provide compressive strain, or the ILD 170 can be configured to provide tensile strain, or the gate G1 and the ILD 170 can be configured to respectively provide the compressive strain and the tensile strain to increase electron mobility of the n-channel C1.

In another aspect, the source S2, the channel C2, the drain D2, the gate G2 and the gate dielectric layer 140 construct a p-channel vertical transistor. The gate G2 and the ILD 180 may independently or collectively provide strain to increase hole mobility of the p-channel C2. Specifically, the gate G2 can be configured provide tensile strain, or the ILD 180 can be configured to provide compressive strain, or the gate G2 and the ILD 180 can be configured to respectively provide the tensile strain and the compressive strain to increase hole mobility of the p-channel C2.

According to some embodiments, a vertical transistor includes a source-channel-drain structure, a gate and a gate dielectric layer. The source-channel-drain structure includes a source, a drain over the source and a channel between the source and the drain. The gate surrounds a portion of the channel. The gate is configured to provide compressive strain substantially along an extending direction of the channel when the vertical transistor is an n-channel vertical transistor, or the gate is configured to provide tensile strain substantially along the extending direction of the channel when the vertical transistor is a p-channel vertical transistor. The gate dielectric layer is between the channel and the gate.

According to some embodiments, a vertical transistor includes a source-channel-drain structure, a gate, a gate dielectric layer and an ILD. The source-channel-drain structure includes a source, a drain over the source and a channel between the source and the drain. The gate surrounds a portion of the channel. The gate dielectric layer is between the channel and the gate. The ILD is over the gate and in contact with the gate dielectric layer and surrounds another portion of the channel. The ILD is configured to provide tensile strain substantially along an extending direction of the channel when the vertical transistor is an n-channel vertical transistor, or the ILD is configured to provide compressive strain substantially along the extending direction of the channel when the vertical transistor is a p-channel vertical transistor.

According to some embodiments, a method of manufacturing a vertical transistor is provided, which includes forming a source-channel-drain structure, in which the source-channel-drain structure includes a source, a drain over the source and a channel between the source and the drain. A gate dielectric layer is formed surrounding the channel. The gate is formed surrounding a portion of the gate dielectric layer. An ILD is formed over the gate and surrounding and in contact with another portion of the gate dielectric layer.

The gate and the ILD are configured to independently or collectively provide strain substantially along an extending direction of the channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A vertical transistor, comprising:
    a source-channel-drain nanowire structure comprising a source, a drain over the source, and a channel between the source and the drain;
    a gate surrounding a portion of the channel, the gate being configured to provide compressive strain substantially along an extending direction of the channel when the vertical transistor is an n-channel vertical transistor, or the gate being configured to provide tensile strain substantially along the extending direction of the channel when the vertical transistor is a p-channel vertical transistor; and
    a gate dielectric layer between the channel and the gate, wherein the gate dielectric layer is in contact with a bottom surface of the drain.

2. The vertical transistor of claim 1, wherein the gate configured to provide the compressive strain substantially along the extending direction of the channel comprises titanium-aluminum (TiAl), titanium-aluminum carbide (TiAlC) or a combination thereof.

3. The vertical transistor of claim 1, wherein the gate configured to provide the tensile strain substantially along the extending direction of the channel comprises tungsten (W).

4. The vertical transistor of claim 1, further comprising an inter-layer dielectric (ILD) over the gate and in contact with the gate dielectric layer and surrounding another portion of the channel, and the ILD is configured to provide tensile strain substantially along the extending direction of the channel when the vertical transistor is the n-channel vertical transistor, or the ILD is configured to provide compressive strain substantially along the extending direction of the channel when the vertical transistor is the p-channel vertical transistor.

5. The vertical transistor of claim 4, wherein the drain has a width greater than a width of the channel.

6. The vertical transistor of claim 5, wherein the width of the drain is greater than a bottom width of the drain.

7. The vertical transistor of claim 6, wherein a width difference between the width of the drain and the bottom width of the drain is lower than or equal to about 10 nm.

8. The vertical transistor of claim 1, wherein the vertical transistor comprises a plurality of the source-channel-drain nanowire structures substantially parallel to one another.

9. The vertical transistor of claim 1, wherein the bottom surface of the drain has an angled side surface connected to a side surface of the channel.

10. A vertical transistor, comprising:
    a source-channel-drain nanowire structure comprising a source, a drain over the source, and a channel between the source and the drain;
    a gate surrounding a portion of the channel;
    a gate dielectric layer between the channel and the gate, wherein the gate dielectric layer is in contact with a bottom surface of the drain; and
    an ILD over the gate and in contact with the gate dielectric layer and surrounding another portion of the channel, the ILD being configured to provide tensile strain substantially along an extending direction of the channel when the vertical transistor is an n-channel vertical transistor, or the ILD being configured to provide compressive strain substantially along an extending direction of the channel when the vertical transistor is a p-channel vertical transistor.

11. The vertical transistor of claim 10, wherein the drain has a width greater than a width of the channel.

12. The vertical transistor of claim 11, wherein the width of the drain is greater than a bottom width of the drain.

13. The vertical transistor of claim 12, wherein a width difference between the width of the drain and the bottom width of the drain is lower than or equal to about 10 nm.

14. The vertical transistor of claim 10, wherein the bottom surface of the drain has a horizontal bottom surface and an angled side surface surrounding the horizontal bottom surface, and an included angle between the horizontal bottom surface and the angled side surface is greater than 90-degrees and smaller than 180-degrees.

15. The vertical transistor of claim 14, wherein a height difference between a highest point of the angled side surface and a lowest point of the angled side surface is lower than or equal to about 30 nm.

16. The vertical transistor of claim 14, wherein the included angle between the horizontal bottom surface and the angled side surface is ranging from about 105-degrees to about 170-degrees.

17. The vertical transistor of claim 10, further comprising a spacer surrounding the drain.

18. The vertical transistor of claim 17, wherein the spacer has a thickness of about 2 to about 15 nm.

19. The vertical transistor of claim 17, wherein the spacer is over and in contact with the ILD.

20. A vertical transistor, comprising:
    a source-channel-drain structure comprising a source, a drain over the source, and a channel between the source and the drain;
    a gate surrounding a portion of the channel;
    a gate dielectric layer between the channel and the gate;
    a spacer surrounding the drain, wherein a height of a lowest point of a bottom surface of the spacer is as same as a height of a lowest point of a bottom surface of the drain; and
    an ILD over the gate and in contact with the gate dielectric layer and surrounding another portion of the channel, the ILD being configured to provide tensile strain substantially along an extending direction of the channel when the vertical transistor is an n-channel vertical transistor, or the ILD being configured to provide compressive strain substantially along an extending direction of the channel when the vertical transistor is a p-channel vertical transistor.

* * * * *